United States Patent [19]

Dines et al.

[11] Patent Number: 4,583,674

[45] Date of Patent: Apr. 22, 1986

[54] APPARATUS FOR APPLYING STRIPES OF SOLDER TO OPPOSITE SIDES OF CIRCUIT BOARDS

[75] Inventors: David R. Dines, Oklahoma City, Okla.; George Svoboda, Sun City West, Ariz.; Robert G. Workman, Yukon City, Okla.

[73] Assignee: AT&T Technologies, Inc., Berkeley Heights, N.J.

[21] Appl. No.: 582,680

[22] Filed: Feb. 23, 1984

[51] Int. Cl.⁴ .................. B23K 31/02; B23K 3/00
[52] U.S. Cl. .................. 228/102; 228/10; 228/11; 228/47
[58] Field of Search .............. 228/102, 8, 9, 10–12, 228/47, 14, 41

[56]     References Cited
U.S. PATENT DOCUMENTS

| 3,140,684 | 7/1964 | Aronson | 228/12 |
| 3,393,853 | 7/1968 | Durr et al. | 228/14 |
| 4,204,477 | 5/1980 | Holstein | 104/106 |
| 4,230,257 | 10/1980 | Genson | 228/41 |
| 4,468,741 | 8/1984 | Simonton | 228/9 |

OTHER PUBLICATIONS

"The Assembly of Surface Mounted Connectors to Bellpac Boards", The Engineer, Third issue, 1983, pp. 30–35.

*Primary Examiner*—Nicholas P. Godici
*Assistant Examiner*—Samuel M. Heinrich
*Attorney, Agent, or Firm*—R. P. Miller; M. de Picciotto

[57]     ABSTRACT

Printed circuit boards 10 having connector terminals 14 and 16 overlaying contact pads 17 and 18 are loaded into fixtures 22 which are conveyor 31 advanced through a pair of solder applying stations 33 and 34 whereat solder is laid and melted at the junctures of the terminals and contact pads. As a fixture approaches a solder applying station, the conveyor is slowed down and a programmed controller 170 is enabled for operation. If a circuit board is sensed by a photodetector 172, a second photodetector is rendered effective to sense elements 176 projecting from a side of the fixture. The sensed elements 176 effectuate the generation of count pulses and output signals to control the movements of solder applying devices 36 to soldering sites where solder feed devices 136 lay discontinuous stripes of solder at the junctures of the contact pads and terminals.

10 Claims, 13 Drawing Figures

| LEVEL | PRESET | 1 | 2 | 3 | |
|---|---|---|---|---|---|
| 0 | A-A | | | X | SLOW DOWN CONVEYOR - 31 |
| 1 | A | X | | | SOLDER STATION IN - 156 |
| 2 | B | | X | | SOLDER FEED BEGIN - 136 |
| 3 | C | | X | | SOLDER FEED HALT - 136 |
| 4 | D | X | | | SOLDER STATION OUT - 156 |
| 5 | E | X | | | SOLDER STATION IN - 156 |
| 6 | F | | X | | SOLDER FEED BEGIN - 136 |
| 7 | G | | X | | SOLDER FEED HALT - 136 |
| 8 | H | X | | | SOLDER STATION OUT - 156 |
| 9 | N | | | X | SPEED UP CONVEYOR, RESET COUNTER - 31 |

APPARATUS FOR APPLYING STRIPES OF SOLDER TO OPPOSITE SIDES OF CIRCUIT BOARDS

FIELD OF INVENTION

This invention relates to methods and apparatus for applying solder to selected sites on opposite sides of printed circuit boards and, more particularly, to applying solder strips to the junctures of banks of terminals projecting from connectors mounted on the boards and banks of contact pads formed along marginal areas on the boards.

BACKGROUND OF THE INVENTION

Many complex electronic equipments are constructed of a number of discrete circuit modules in the form of printed circuit boards having circuit paths formed on each side to which may be connected various electrical components. Interconnection of a number of individual circuit boards to form the final equipment is attained by use of connectors having terminals which engage contact pads or circuit termination points formed along one or more of the edges of each circuit board. These circuit board connectors are usually provided with sockets to allow assembly onto arrays of terminal pins mounted in a common plane known as a back plane. The terminal pins are selectively wired and interconnected to complete the particular equipment. The edge connector may also be engaged by a number of individual plug connectors secured to ends of wires of a cable harness.

In many instances, it is necessary that the terminals projecting from an edge connector be soldered to insure good electrical contact between the terminals and the engaged pads on the edge of the circuit board. In the past, a number of soldering expedients have been developed and utilized to solder these edge connectors to the circuit boards. One expedient that is extensively used, contemplates, that prior to assembly of the connector on the board, pre-solder coatings are applied to the contact pads and terminals and then heat is applied to reflow the solder to bond the terminals to the pads.

In another recent expedient, connectors are assembled on the circuit boards with the terminals mechanically pressed against the circuit pads. The boards are loaded into fixtures which are advanced in a vertical loop to pass through a solder application station. Each fixture is provided with a linear cam that is contoured to control closures of switches which in turn control the operation of the component mechanisms comprising the soldering machine. As the fixture approaches the soldering station, facilities are initiated to control the movement of a pair of solder applicators toward the board whereafter solder wires with rosin cores are advanced by a pair of selectively driven wheels to lay the wires onto top surfaces of the advancing terminals. Hot air is directed at the site where the solder wires are laid on the terminals so that the solder wires and the areas immediately adjacent to the soldering site are heated to such an extent that the solder melts, flows into and bonds the junctures of the connector terminals and the contact pads.

SUMMARY OF THE INVENTION

The invention contemplates, among other things, a soldering apparatus for applying discontinuous stripes of solder to sets of discontinuous terminals projecting from a connector to overlay contact pads formed along opposed marginal sections of a printed circuit board.

More particularly, a connector, with two discontinuous sets of projecting terminals, is secured to a printed circuit board so that the terminals overlay two rows of contact pads positioned along opposed edge sections of the board. Circuit boards are loaded into open frame supports which are advanced seriatim through a pair of solder applying stations, whereat solder stripes are applied to bond the ends of a first set of terminals to the contact pads on one side of the board and then solder stripes are applied to bond the ends of a second set of terminals to the contact pads on the opposite side of the board. Instrumentalities are provided to rotate the open frame supports as the supports advance from one soldering station to the other.

The operation of the apparatus is under the control of a programmed controller which is effective to generate a series of output signals. As each frame support approaches a soldering station, a photo detector operates to impress an enabling signal to the controller. If a board is present, a second photo detector is rendered effective to sense a series of uniformly spaced, travel indicating elements positioned along and secured to one edge of the frame support. If a board is not present in the support frame, the first photo detector is reoperated and the controller is reset.

The second photo detector senses the travel indicating elements to generate pulses which are indicative of the advance of the frame through a soldering station and which are applied to the programmable controller to actuate a counter. The controller is programmed so that certain predetermined counts registered in the counter are effective to produce output control pulses for the various component mechanisms of the apparatus. An initial output pulse is effective to slow down the advance of the support frames passing through the solder applying stations. Subsequent output pulses are utilized to control movements of solder applying devices to lay discontinuous stripes of solder at the junctures of the terminals and the contact pads.

DESCRIPTION OF DRAWING

Other advantages and features of the invention will be apparent upon consideration of the following detailed description in conjunction with the drawing wherein.

DETAILED DESCRIPTION

Figure 1:
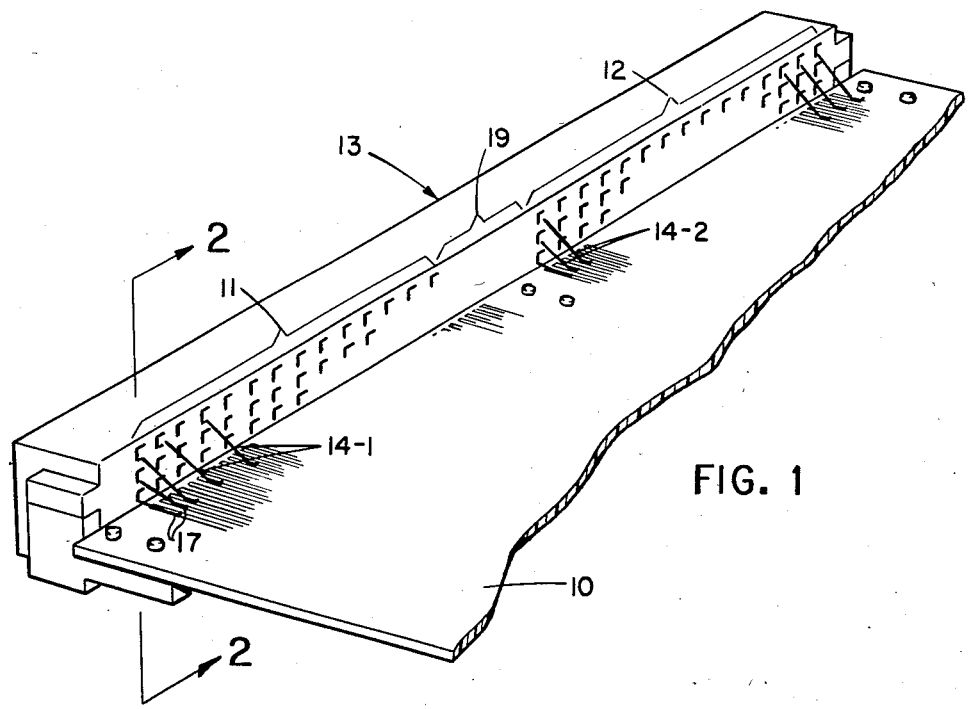
FIG. 1 is a perspective view of the printed circuit board having a connector mounted thereon.
Figure 2:
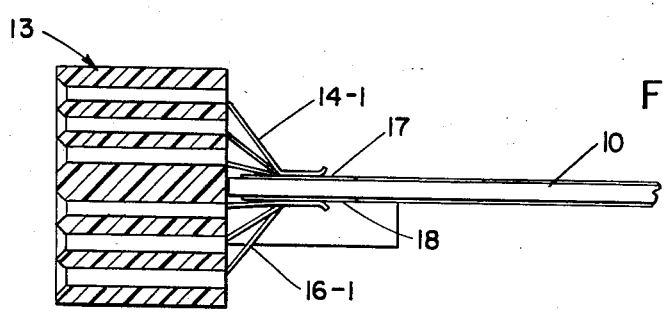
FIG. 2 is a cross sectional view of the connector and the board particularly illustrating connector terminals positioned in overlaying relation to contact pads formed on opposite sides of the circuit board.
Figure 3:
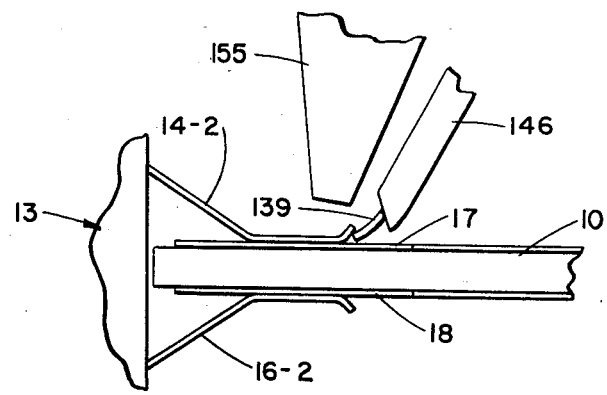
FIG. 3 is an enlarged end view of a portion of the connector terminals and the contact pads shown in FIG. 1, illustrating the manner in which a solder applying tube directs a solder strip at the juncture of a terminal and of a contact pad.

Referring to FIGS. 1, 2 and 3, there is shown a printed circuit board 10 having two sections 11 and 12 of a connector 13 secured to one edge. Projecting from each section of the connector are two discontinuous sets of wire-like terminals 14-1, 16-1, 14-2 and 16-2 which overlay and resiliently engage circuit pads 17 and 18 formed on opposite marginal sections of the circuit board. The soldering machine shown in the drawing (FIGS. 4 through 12) is designed to apply solder stripes to the junctures of the terminals and the circuit board pads without applying the solder stripe to an intervening section 19 of the board between the connector sections 11 and 12.

Figure 4:
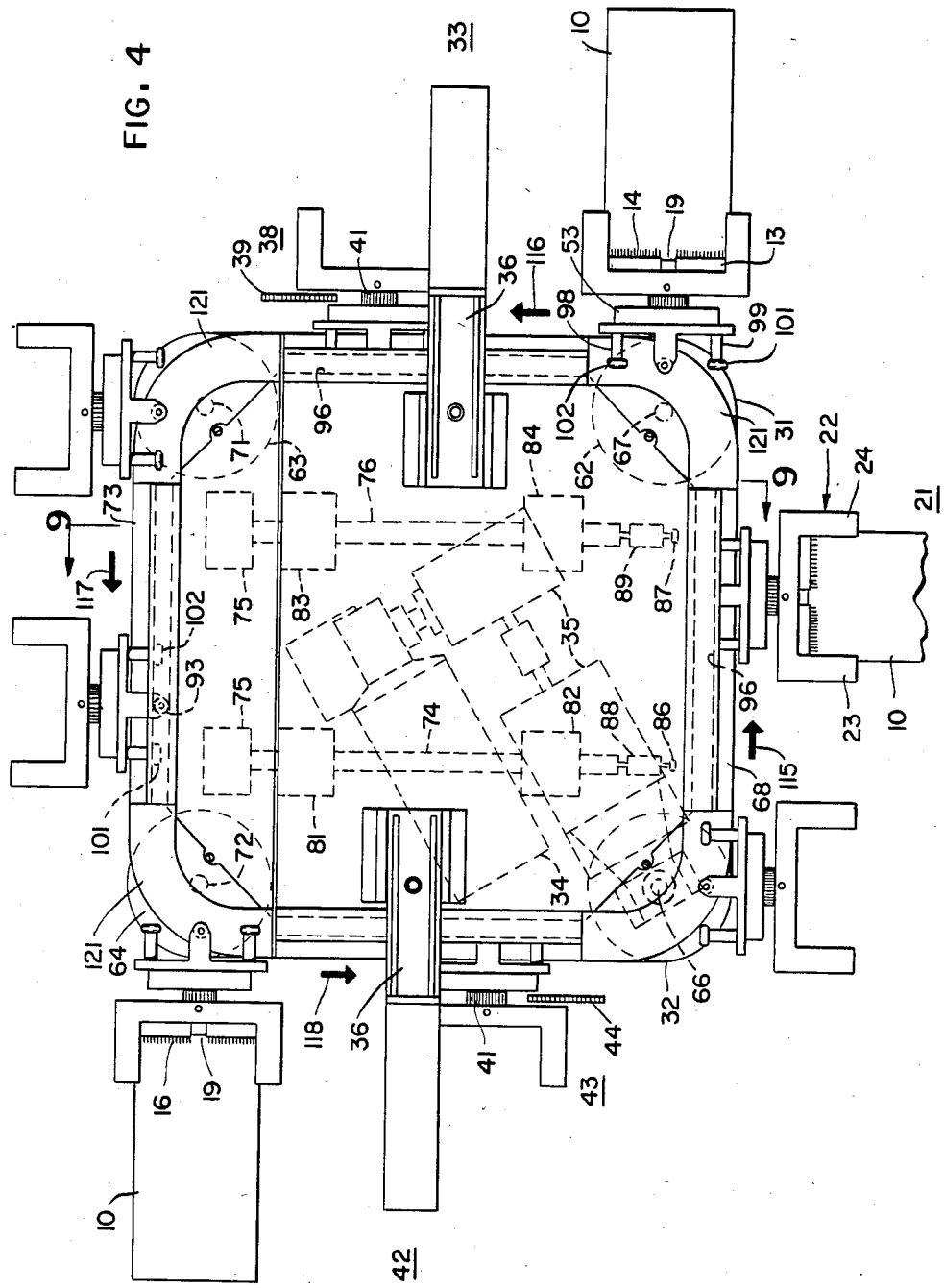
FIG. 4 is a general plan view of the conveyor system for advancing printed circuit boards through a pair of solder applying stations embodying the principles of the invention.

Attention is directed to FIG. 4 which discloses a loading station 21 where an attending operator pushes an unsoldered circuit board 10 into one of a series of open frame holding fixtures 22. Each fixture 22 is of a U-shaped configuration having arms 23 and 24 which support pairs of guides 26 and 27 (see FIG. 6) between which the thin side edges of the circuit board are pushed. A series of spring biased detents 28 (see FIG. 5) are mounted in the arms 23 and 24 to bear against and hold the circuit board in the fixture.

Figure 7:
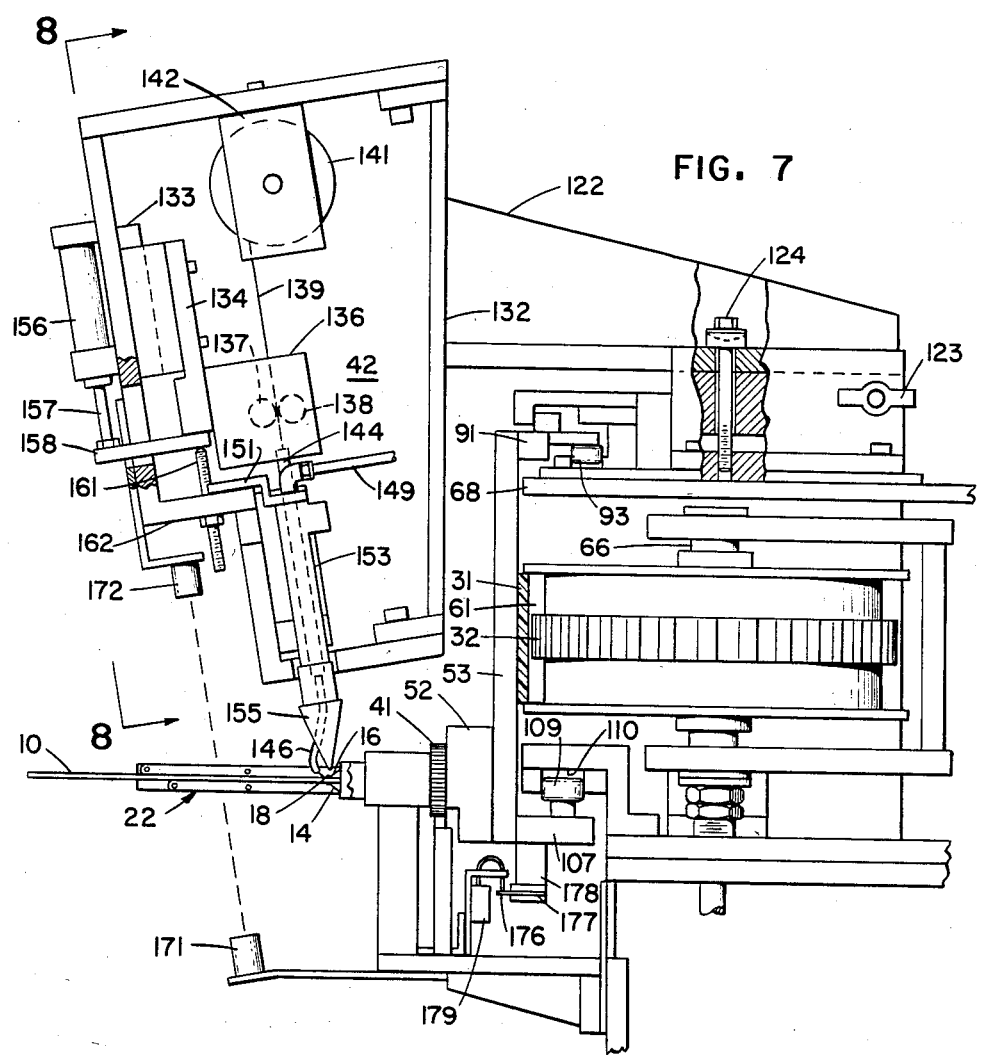
FIG. 7 is a side elevational view of one solder applying device for applying a discontinuous strip of solder on one side of a printed circuit board.
Figure 8:
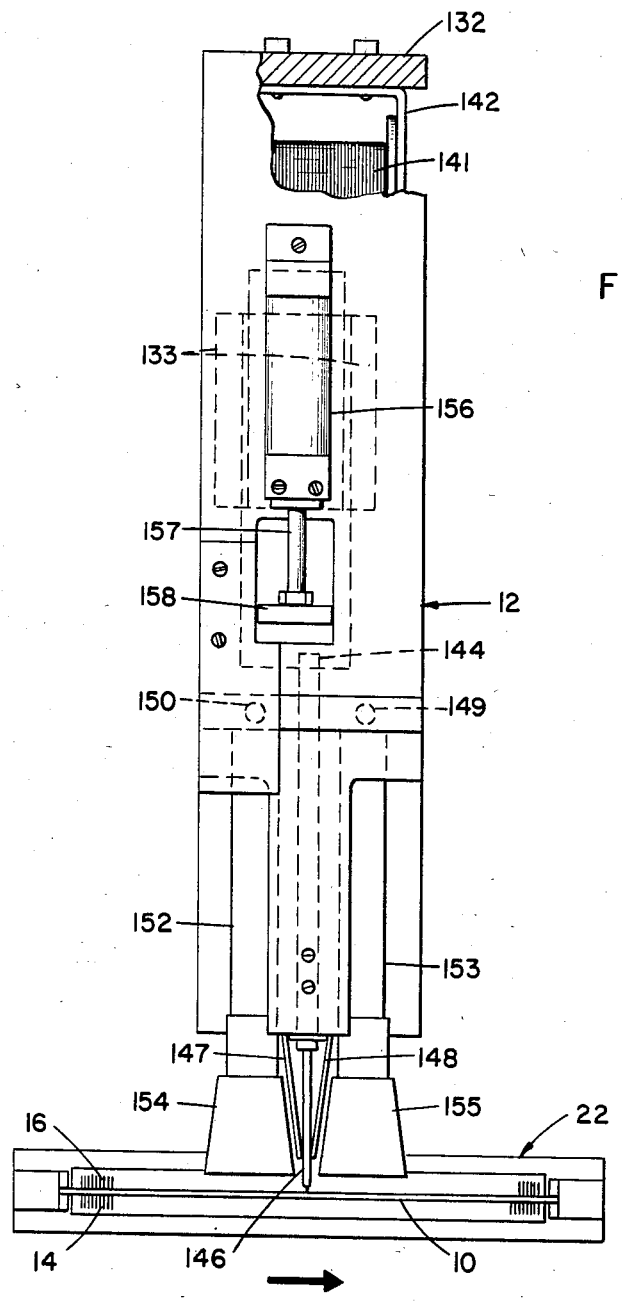
FIG. 8 is a front view of the soldering device shown in FIG. 7 and particularly illustrating a pair of nozzles for applying heated air to the contact pads and terminals as these elements approach and leave a solder applying site.
Figure 9:
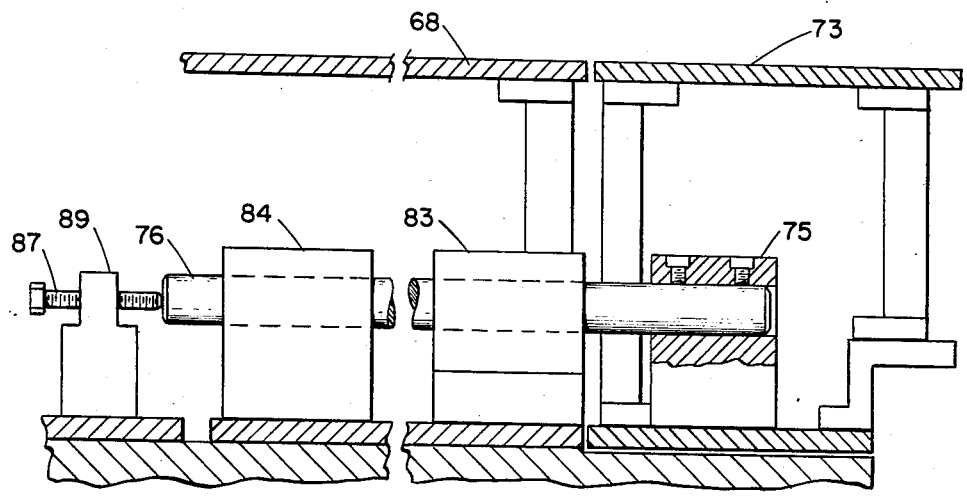
FIG. 9 is a sectional view taken along line 9—9 of FIG. 4 showing two separate and adjustable frame sections for supporting and tensioning the conveyor belt.
Figure 10:
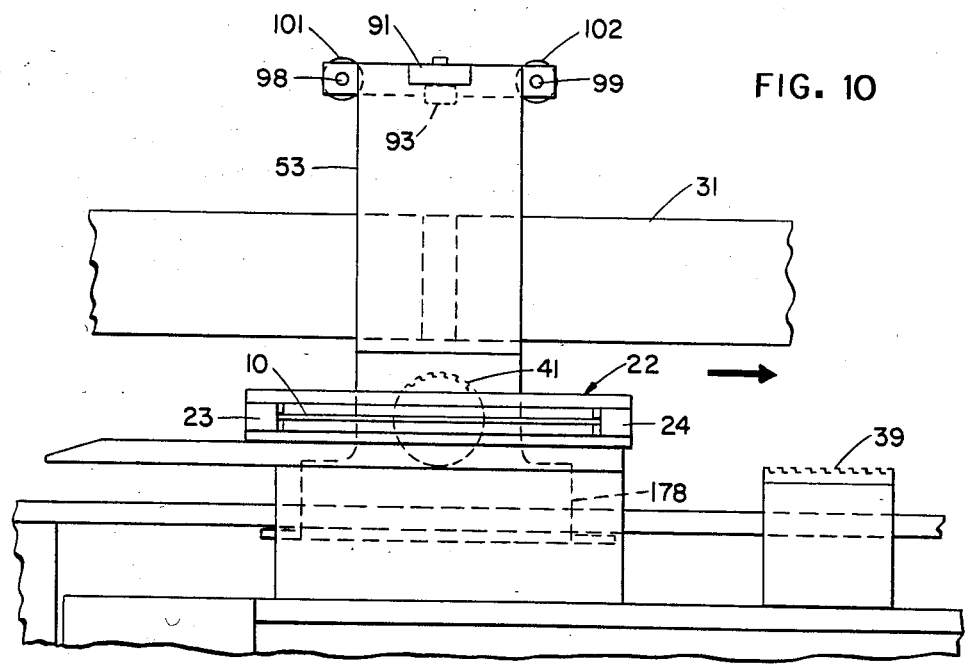
FIG. 10 is a partial right side view of the conveyor system shown in FIG. 4 particularly illustrating a mechanism for turning over a circuit board holding fixture as the fixture advances from a first solder applying site to a second solder applying site.
Figures 12, 13:
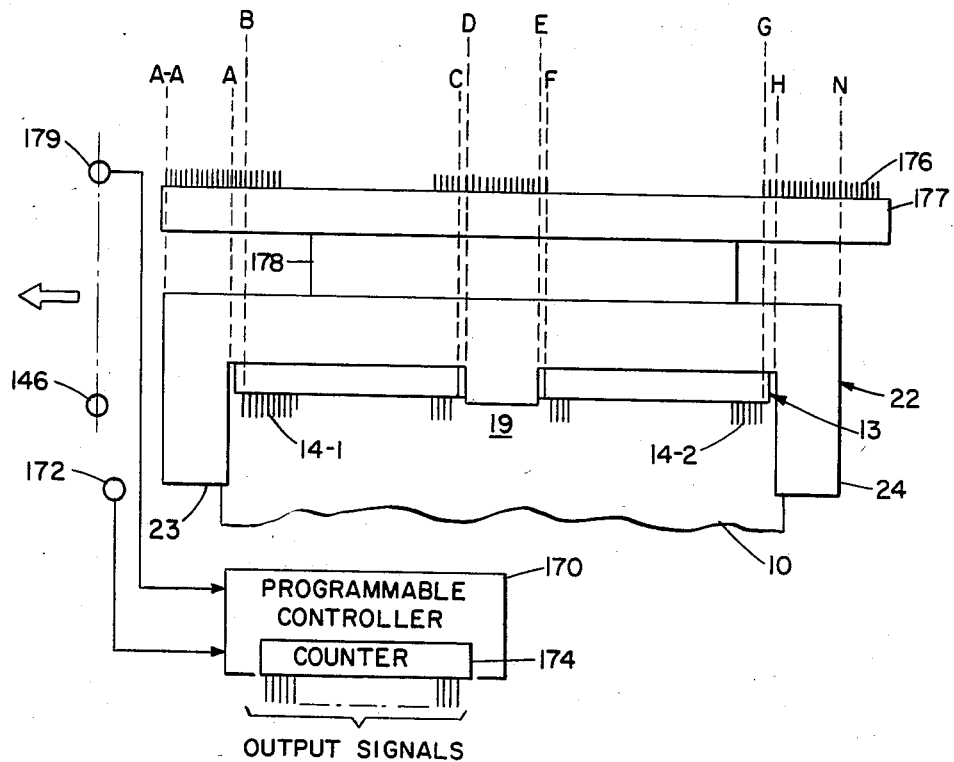
FIG. 12 is a top schematic view of one fixture and a circuit board together with a pair of photodetector devices for controlling the operation of the conveyor system and the solder applying devices.
FIG. 13 is a chart depicting changes in the operational state of control relays and solenoids in response to count pulses applied to a programmed controller.

In general, referring to FIG. 4, circuit boards are loaded at station 21 into the fixtures 22 which are rotatably mounted on a toothed conveyor belt 31. The belt is driven by a sprocket 32 to advance each circuit board through a first solder stripe applying station 33. The sprocket is rotated by a commercial drive which includes a controlled speed motor 34 and standard gear reduction braking and clutching mechanism 35. At station 33, a solder feeding and applying device 36 of the type shown in FIGS. 7 and 8 is lowered to apply a discontinuous stripe of solder to the junction of the terminals 14 and the circuit pads 17. The solder stripe is not applied to the intervening section 19 of the board 10. Following application of the solder stripe, the solder applying device 36 is withdrawn and the fixture is advanced to a fixture turnover station 38 (see FIG. 4) wherein a rack 39 engages a gear 41 on the fixture 22 to rotate the fixture 180°. Subsequent advancement of the conveyor belt 31 moves the fixture to a second solder stripe applying station 42 (see FIGS. 7 and 8) where a second discontinuous stripe of solder is applied to the junction of the terminals 16 and contact pads 18. Again no solder is applied to the intervening section 19 on the board. Following application of the solder at station 42, the conveyor belt advances the fixture into a second turnover station 43 where a second rack 44 engages the gear 41 to restore the fixture to the initial orientation. The fixture is then returned to the load station 21 where the attending operator removes the soldered circuit board 10.

Figure 5:
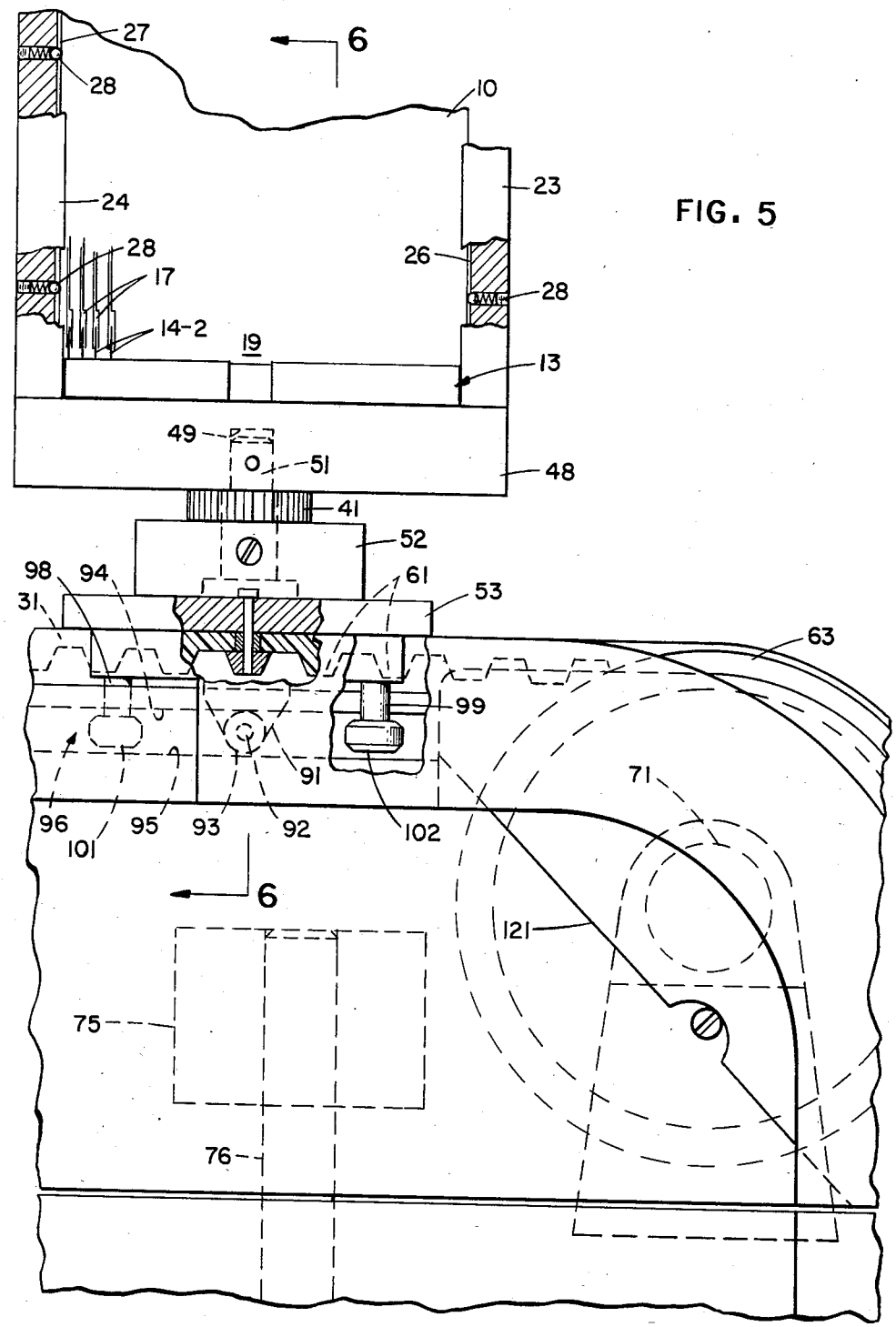
FIG. 5 is an enlarged plan view of one corner of the conveyor system showing a typical fixture mounted on a conveyor belt for holding a printed circuit board.
Figure 6:
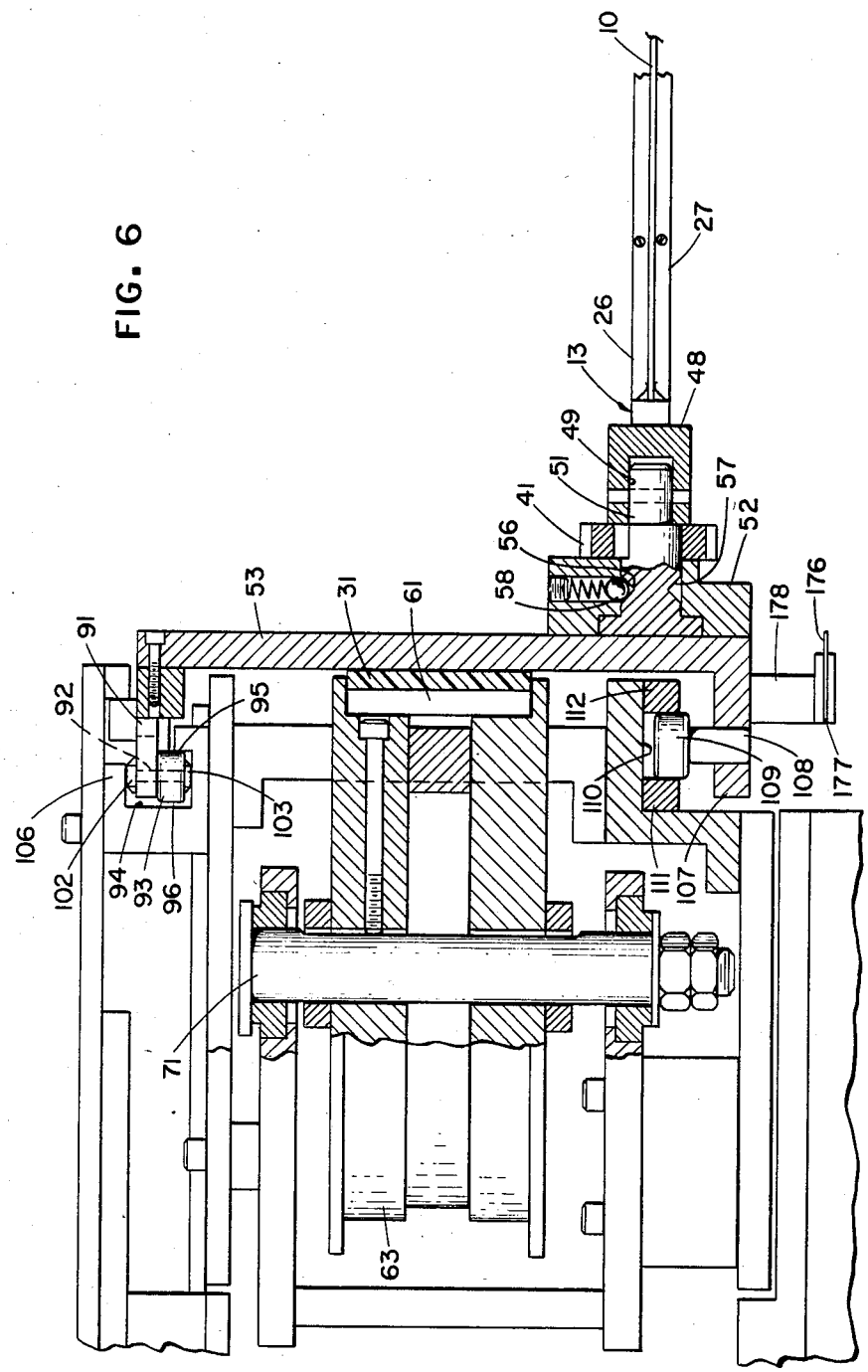
FIG. 6 is a sectional view taken along line 6—6 of FIG. 5 depicting the structure for rotatably mounting the holding fixture on a plate attached to the conveyor belt.
Figure 11:
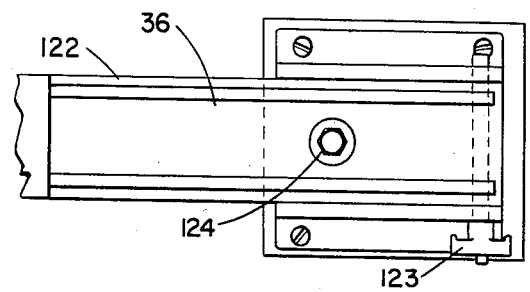
FIG. 11 is a partial top view illustrating a lock pin and bolt arrangement for detachably mounting the solder applying device to the apparatus.

More particularly, considering the details of construction of the circuit board holding fixture 22 and referring to FIGS. 5 and 6, the fixture is shown to include a cross-member 48 interconnecting the arms 23 and 24. The cross-member is formed with a bore 49 into which is pinned one end of an axle 51. Axle 51 is rotatably mounted in a bearing block 52 secured to a plate 53 bolted to the toothed conveyor belt 31. It will be noted that the turnover gear 41 is keyed to the axle 51 and interposed between the fixture cross-member 48 and the bearing block 52. The axle 51 is provided with a pair of diametrically opposed depressions 56 and 57 which are adapted to selectively receive a spring loaded ball detent 58 to temporarily lock the fixture in one of the two positions.

When the conveyor belt 31 is advanced to move the fixture 22 from the first soldering station 33 to the turnover station 38, the gear 41 engages the stationary rack 39. The length of the rack is selected to rotate the gear 41 and the fixture through an arc of 180° to thus move the unsoldered contact pads and terminals to an up or exposed position in anticipation of movement into the second solder station 42.

Attention is directed to FIGS. 4, 5, 6 and 9 for a further understanding of the conveyor system. The belt 31 is constructed of a rubber base material and has teeth 61 (FIGS. 5 and 6) which mesh with the drive sprocket 32 (FIG. 4) and a series of three idler sprockets 62, 63 and 64. The drive sprocket 32 and the idler 62 are mounted on shafts 66 and 67 which are rotatably mounted in a stationary section 68 of the machine framework while the idler sprockets 63 and 64 are mounted on shafts 71 and 72 which are rotatably mounted in bearings secured to a movable section 73 of the machine framework. The moveable framework section 73 is secured through the agency of a pair of anchoring blocks 75 to a pair of horizontal support rods 74 and 76 (see FIGS. 4 and 9) that slideably extend through pairs of bearing blocks 81, 82, 83 and 84 mounted to the stationary framework section 68. A pair of adjusting screws 86 and 87 are mounted to extend through supports 88 and 89 secured to the stationary framework 68. The screws 86 and 87 abut the ends of the rods 74 and 76. Upon turning the screws, the rods are pushed to extend the movable section 73 of the framework, and thus move the shafts 71 and 72 together with the sprockets 63 and 64 to adjust the tension in the conveyor belt 31.

The conveyor belt 31 and plates 53 are maintained in a vertical plane during movement through the various work stations. More specifically, referring to FIGS. 5 and 6, one plate 53 is shown with a bracket 91 attached thereto. A pin 92 extending downwardly from the bracket rotatably supports a follower roller 93 that rides between side walls 94 and 95 of a trough trackway 96. In addition, a pair of pins 98 and 99 (see also FIGS. 4 and 10) extend from the plate 53 to rotatably support a pair of follower rollers 101 and 102 that ride along a bottom section 103 of the trough-like trackway 96. A retainer plate 106 is mounted to the machine framework to overlay the trough trackway so as to confine the rollers 101 and 102 to ride within the trough trackway 96.

As shown in FIG. 6, a flange 107 projects from the bottom of the plate 53 to provide a mounting for a vertically extending pin 108 on which is rotatably mounted a follower roller 109. The follower roller rides within a second trough trackway 110 consisting of side rails 111 and 112 secured to the machine framework.

The trackway 96 does not continue along the entire conveyor path but is confined, as shown in FIG. 4 to straight run sections 115, 116, 117 and 118 which stop in the vicinity of the drive and idler sprockets 32, 62, 63 and 64. Overlaying each sprocket and secured to the machine framework is a corner plate 121 having a top surface aligned with the bottom 103 of each trough trackway section. In operation of the machine, the follower rollers 101 and 102 move from the trough trackway sections so that the rollers ride on the top surface of the corner plates 121. This construction eliminates the need for providing curved trackway sections at the corners of the conveyor path in which there would be a possibility of the rollers binding. It will be noted that the follower rollers 101 and 102 (see FIGS. 4, 5 and 6) have beveled sides to facilitate reentry into the trough trackways 96 upon leaving the corner plates 121. The bottom 103 of each trough trackway 96 maybe beveled in a complementary fashion to the beveled rollers 101 and 102 so that each of the rollers 101 and 102 is guided into the center of the trackway sections to thus insure that the follower roller 93 is guided into position to ride between the sides 94 and 95 of the trackway.

Referring now to FIGS. 7 and 8, there is shown one of the pair of soldering facilities for laying two discontinuous stripes of solder on opposite sides of the circuit board. The soldering facilities at stations 33 and 42 are identical and FIGS. 7 and 8 disclose the soldering equipment at station 42. A support structure 122 is secured by a removable lock pin 123 (see also FIG. 12) and a lock bolt 124 to a section of the machine framework 68. By removing the lock pin and bolt, the soldering equipment may be removed for servicing while a second equipment is installed to allow for continued use of the overall apparatus. The structure 122 includes an open frame 132 on which is mounted gibs 133 to support a slide 134. Attached to slide 134 is a housing 136 containing a solder feed device comprising a pair of rotatable wheels 137 and 138 between which passes solder wire 139. The solder wire 139 emanates from a solder supply reel 141 rotatably mounted in a bracket 142 secured to the frame 132. The wheels 137 and 138 are driven by a motor (not shown) so as to advance the solder wire through a tube 144 secured to housing 136.

The solder feed tube 144 is shown in the down position so that solder wire emanating from the bottom of the tube is placed proximate to the junction of the advancing terminals 16-1 and the circuit pads 18. More specifically, a lower end 146 of the tube 144 is formed with an arcuate bend to provide an exit opening that is directed at a soldering site which is immediately adjacent to the juncture between the terminals 16 and the circuit pads 18. Positioned on opposite sides of the lower section of the solder feed tube 144 are a pair of radiation heat shields 147 and 148. Pressurized air is impressed through a pair of inlet fittings 149 and 150 mounted in and extending through a fixed bracket 151. The air passes from the fittings through a pair of tubes 152 and 153 in which are mounted suitable commercial electrical resistance heaters (not shown) to heat the air which is impressed through a pair of nozzles 154 and 155 and onto the circuit board 10. The heat shields 147 and 148 isolate the exit end of the tube 144 from extraneous heating which avoids the melting of the solder strip as the strip exits from the tube and is directed at the junctures of the circuit board pads 18 and connector terminals 16.

Air passing through the tube 152 and the nozzle 154 serves to preheat the terminals and circuit pads during approach to the solder application site. Sufficient heat is imparted to the board in the vicinity of the pads and the abutted terminals so that the solder is melted as it is advanced into the junctures of the pads and the terminals. The heater tube 153 and the nozzle 155 also act to apply heated air to the circuit board and function to abet the melting of the exiting solder strip and to maintain sufficient heat to prevent too rapid solidification of the solder as the soldered terminals and circuit pads leave the solder application site and thus alleviate thermal shock to the soldered joints. Suitable thermocouples (not shown) are mounted in the heater tubes 152 and 153 to control auxiliary circuitry that supplies the electrical energy to the heater devices positioned within the heater tubes so that appropriate consistent heat is available to melt the solder.

In order to raise the solder feeding and applying device 36 from the solder application site, an air cylinder 156 (see FIG. 7) is provided. Air cylinder 156 controls piston rod 157 that mounts a lifter bar 158. Lifter bar 158 abuts the bottom of the slide 134. During the times when the soldering operation is to be discontinued, the slide 134 is elevated to move the housing 136 and the solder feed tube 144 upwardly. An adjustable stop 161 is threaded through a member 162 of the structure 132 to provide a stop for the downward movement of the lift bar 158, thus providing an adjustment for setting the elevation of the application of the solder wire emanating from the bottom of the tube 144. The member 162 also acts as a support for the bracket 151 in which the air inlet fittings 149 and 150 are mounted.

A commercial programmable controller 170 (see FIG. 12) is provided to initiate the up and down movements of the solder feeding and applying device 36 and the start/stop of the wire feed wheels 137-138. The programmable controller is enabled for operation by a circuit board detector comprising an emitter 171 (see FIG. 7) that projects an infrared beam on a detector 172. The beam is directed along a path that is intercepted by movement of a fixture 22 into a soldering station.

The controller is enabled so long as the infrared beam is intercepted. If a circuit board is not within the fixture 22 then the beam is reestablished to reset the enabled controller. The enabled controller includes a counter 174 which is sequenced or stepped by sensing teeth 176 on an encoder strip 177 (see FIGS. 7 and 12) mounted on a support post 178 depending from the flange 107 attached to the plate 53. The teeth 176 are sensed by a fiber optic sensor 179 so that the passage of each tooth is effective to cause the sensor to generate a pulse which is applied to the controller. After a first predetermined count AA (see chart labelled FIG. 13), indicative of a predetermined number of incremental advances of the holder 22, the controller produces an output signal which is applied to control the motor drive 34–35 for the sprocket 32 and which is effective to slow the sprocket and, hence, the advancement of a circuit board through the soldering station. At A number of counts, the air cylinder 156 is operated to move the piston rod 157 downwardly to lower the solder feed housing 136 and the solder feed tube 144. After B number of counts, the solder wire feed 137–138 is operated to move the solder wire through the exit end of the tube 144. The solder advances concomitantly in accordance with the advance of the circuit board 10 to lay a stripe of solder in the vicinity of the junction of the connector terminals 14-1 and the circuit board pads 17. At C number of counts, indicative of the intervening section 19 of the board between the two discontinuous banks of terminals 14-1 and 14-2, the solder wire feed 137–138 is interrupted. After D number of counts, the air cylinder 156 is reversed to withdraw the housing 136 and the solder feed tube 144.

The board 10 continues to advance through the soldering station and no solder is laid on the intervening section 19. At count number E, the air cylinder 156 is again operated to move the solder feed housing 136 and the solder tube 144 back into the down position. At count number F, the solder feed device 137–138 is reoperated to recommence the feed of the solder wire. A second solder stripe is thus laid across the second bank of terminals 14-2 and the associated contact pads 17. When the solder is laid across the second bank of terminals and contact pads, G number of counts are registered and a signal is generated to interrupt the solder feed 137–138. At H number of counts, the air cylindeer 156 is again reversed to withdraw the solder housing 136 and the solder tube 144. At N number of counts, a signal is generated and applied to the control for the motor drive 34–35 so that the drive sprocket 32 is operated to run at the fast speed thus rapidly moving the soldered circuit board to the turnover station. The N count is also effective to reset the emitter 171 and detector 172 device to an initial condition in anticipation of detecting the next fixture 22 containing a circuit board. In addition, the N count resets the controller for the next cycle of operation.

What is claimed is:

1. An apparatus for applying stripes of solder to two rows of terminals overlaying contact pads arrayed along opposite sides of a printed circuit board, which comprises:
   an open frame holder for receiving and supporting opposed edges of a printed circuit board;
   a pair of solder applying devices each having a solder feeding tube for guiding a strip of solder through an exit end thereof;
   a closed loop conveyor means for continually advancing said holder through a pair of soldering sites each spaced from a respective exit end of said solder feeding tubes;
   means for advancing and withdrawing said solder applying devices to move the exit end of a corresponding solder feeding tube into and out of a soldering site;
   means for controlling the speed of said closed loop conveyor means and the advance and the withdrawal of said solder applying devices;
   first means positioned at each solder applying device for sensing the presence of a frame holder approaching a soldering site for generating a signal to enable operation of said controlling means;
   means advanced with said frame holder having a series of uniformly spaced elements;
   second means positioned at each solder applying device for sensing said uniformly spaced elements as said elements move past a corresponding soldering site and for generating and applying pulses to said controlling means;
   means responsive to the receipt of a predetermined number of pulses by said controlling means for advancing a solder applying device to a corresponding soldering site;
   means responsive to the receipt of a subsequent pulse for feeding a solder strip through the tube of the advanced solder applying device to said soldering site;
   means for melting the solder fed to said soldering site; and
   means for rotating said holder during its advance between soldering sites to present a different side of the printed circuit board to each one of the solder applying devices.

2. An apparatus as defined in claim 1 wherein said first sensing means resets said enabled controlling means upon failure of said sensing means to sense the presence of a printed circuit board in said frame holder.

3. An apparatus as defined in claim 1 for applying discontinuous stripes of solder to discontinuous rows of terminals, wherein said controlling means disrupts the solder feed upon receipt of a predetermined number of pulses indicative of the discontinuance of the terminals, and commences said solder feed upon receipt of subsequent number pulses indicative of the first of the remainder of said terminals.

4. An apparatus for applying stripes of solder to opposite sides of printed circuit boards, which comprises:
   conveyor means including at least four sprockets mounted on vertically extending shafts and a closed loop belt mounted on said sprockets;
   a plurality of spaced mounting plates secured to said belt;
   a U-shaped holding fixture rotatably mounted on each of said mounting plates to extend in a horizontal plane for receiving a printed circuit board between the arms of said U-shaped fixture;
   a pair of soldering devices spaced along the path of movement of said holding fixture, each of said soldering devices including a pair of feed wheels for advancing a strip of solder into a tube having an exit end adjacent to the path of movement of said holding fixtures and spaced from a soldering site in proximity to the path of movement of a printed circuit board received in said holding fixture;
   means for rotating at least one of said sprockets to drive said conveyor means at a first predetermined speed to successively move said holding fixtures to the soldering sites associated with said soldering devices;
   means responsive to the approach of each holding fixture to a soldering site for controlling said sprocket rotating means to drive said conveyor means at a second slower predetermined speed and for reinitiating the conveyor means to drive the fixtures at said first predetermined speed as the fixture leaves the soldering site;

means operated following the slow down of said conveyor means for moving the soldering devices toward the path of movement of the fixtures to position the exit ends of the tubes in the soldering sites, and for initiating operation of said feed wheels to advance the solder strip into the tubes;

means for heating the soldering sites to melt the solder fed onto the moving printed circuit boards; and means for rotating said fixtures moving from a first soldering site to the second soldering site to present the opposite side of each printed circuit board to the second soldering device.

5. An apparatus as defined in claim 4 wherein said conveyor speed control means and said soldering device moving means comprise:

a first photodetector means for sensing the approach of a holding fixture to a soldering site and generating an enable signal;

a coded bar attached to each mounting plate having a predetermined number of fingers spaced to control the generation of count pulses;

a second photodetector means for sensing the fingers on the coded bar for generating count pulses; and a controller initiated into operation by said enable signal and responsive to said count pulses for operating said soldering device moving means.

6. An apparatus as defined in claim 5 wherein said controller responds to a first predetermined number of count pulses to raise the soldering device and interrupt operation of said solder feed wheels and responds to a second predetermined number of count pulses to again lower the soldering device and reinitiate operation of the solder feed wheels for laying an interrupted stripe of solder on a printed circuit board passing through a soldering site.

7. An apparatus as defined in claim 4 which includes:

sections of horizontal trackways extending between said sprockets in a plane elevated from the plane of said sprockets;

rollers mounted on horizontal shafts extending from said holding fixture for movement along said trackway sections to support said belt and said holding fixture; and flat plates mounted above said sprockets in the plane of said trackways and extending between ends of adjacent trackway sections to support said belt and said fixture as said fixture moves about said sprockets.

8. A method of applying solder stripes to junctions of connector terminals and contact pads arrayed along opposite sides of a printed circuit board, which comprises:

rotatably mounting a plurality of holding fixtures on a closed loop conveyor belt;

mounting an assembly including a connector and a printed circuit board in each of the holding fixtures so that the board extends horizontally away from the conveyor belt;

continually advancing a succession of assembled connectors and printed circuit boards through a pair of spaced soldering sites, said connectors having their terminals abutting contact pads on opposite sides of the circuit boards;

sensing the approach of a printed circuit board to a soldering site and generating an enabling pulse to condition a controller for operation;

generating count pulses indicative of the advance of the circuit boards through the soldering sites;

applying said count pulses to said conditioned controller to produce a succession of control signals;

advancing a solder dispensing tube in response to a first control signal into position to direct a solder strip at the junctions of the abutted contacts and terminals on the board moving through a soldering site;

feeding the solder strip through the tube to emanate toward the moving abutted contacts and terminals in response to a second control signal;

applying a first stream of hot air to the abutted contacts, terminals and the adjacent sections of the printed circuit boards approaching the soldering sites to heat the abutted contacts and terminals to a temperature sufficient to melt the solder emanating from the tube and directed against the abutted contacts and terminals; and rotating the holding fixtures to turn the boards over after leaving a first soldering site and during advance to the second soldering site.

9. A method as defined in claim 8, which further includes:

applying a second stream of hot air to the soldered terminals and contacts leaving the soldering sites.

10. A method as defined in claim 8 which includes:

sensing the presence of a board in a holding fixture as the fixture approaches a soldering site; and interrupting operation of said controller upon failure to sense the presence of a circuit board in a fixture.

* * * * *